United States Patent [19]
Rupp et al.

[11] Patent Number: 6,096,664
[45] Date of Patent: Aug. 1, 2000

[54] METHOD OF MANUFACTURING SEMICONDUCTOR STRUCTURES INCLUDING A PAIR OF MOSFETS

[75] Inventors: Thomas S. Rupp, Stormville; Stephan Kudelka, Wappingers Falls, both of N.Y.; Jeffrey Gambino, Gaylordsville, Conn.; Mary Weybright, Pleasant Valley, N.Y.

[73] Assignees: Siemens Aktiengesellschaft, Munich, Germany; International Business Machines Corporation, Armonk, N.Y.

[21] Appl. No.: 09/130,324

[22] Filed: Aug. 6, 1998

[51] Int. Cl.[7] .................. H01L 21/8234; H01L 27/088
[52] U.S. Cl. .................. 438/981; 438/275; 438/279; 438/296; 257/390
[58] Field of Search .................. 438/296, 275, 438/279, 981

[56] References Cited

U.S. PATENT DOCUMENTS

| | | | |
|---|---|---|---|
| 5,182,234 | 1/1993 | Meyer | 438/981 |
| 5,502,009 | 3/1996 | Lin | 438/981 |
| 5,576,226 | 11/1996 | Hwang | 438/981 |
| 5,595,922 | 1/1997 | Tigelaar et al. | 438/981 |
| 5,637,520 | 6/1997 | Cappellitti et al. | 438/981 |
| 5,861,347 | 1/1999 | Maiti et al. | 438/981 |
| 5,926,729 | 7/1999 | Tsai et al. | 438/981 |

FOREIGN PATENT DOCUMENTS

WO 98 08253   2/1998   WIPO .

OTHER PUBLICATIONS

Patent Abstracts of Japan, vol. 1996, No. 09, Sep. 30, 1996 & JP 08 130250 A (Fuji Electric Co. Ltd), May 21, 1996.
Patent Abstracts of Japan, vol. 1997, No. 06, Jun. 30, 1997 & JP 09 036243 A (Ricoh Co. Ltd), Feb. 7, 1997.

*Primary Examiner*—Charles Bowers
*Assistant Examiner*—David S. Blum
*Attorney, Agent, or Firm*—Stanton C. Braden

[57] ABSTRACT

A method for forming a pair of MOSFETs in different electrically isolated regions of a silicon substrate. Each one of the MOSFETs has a different gate oxide thickness. A first layer of silicon dioxide is grown to a predetermined thickness over the surface of the silicon substrate. One portion of the silicon dioxide layer is over a first isolated region and another portion of the silicon dioxide layer being over a second isolated region. An inorganic layer is formed over the silicon dioxide layer extending over the isolated regions of the silicon substrate. A first portion of the inorganic layer is over the first isolated regions and a second portion of the inorganic layer is over the second isolated regions. A photoresist layer is formed over the inorganic layer. The photoresist layer is patterned with a window over the first portion of the inorganic layer. The photoresist layer covers the second portion of the inorganic layer. The inorganic layer is patterned into an inorganic mask by bringing a etch into contact with the patterned photoresist layer to selectively remove the first portion of the inorganic layer an thereby expose an underlying portion of the surface of the silicon substrate while leaving the second portion of the inorganic layer. The inorganic mask is used to selectively remove exposed portions of the grown silicon dioxide. The inorganic mask is removed. A second layer of silicon dioxide is grown over the exposed underlying portion of the silicon substrate to a thickness different from the thickness of the first layer of silicon dioxide. The silicon dioxide layers are patterned into gate oxides for each of a corresponding one of the pair of MOSFETs.

26 Claims, 3 Drawing Sheets

METHOD OF MANUFACTURING SEMICONDUCTOR STRUCTURES INCLUDING A PAIR OF MOSFETS

BACKGROUND OF THE INVENTION

This invention relates generally to semiconductors and more particularly to semiconductor devices having different gate oxide thickness.

As is known in the art, applications may require Metal Oxide Semiconductor Field Effect Transistors (MOSFETs) having different gate oxide thicknesses. Existing techniques use photoresist masks to open one of the two different oxide gate regions. The use of a photoresist mask however reduces the quality of the MOSFET devices because of residues and contamination in the photoresist.

SUMMARY OF THE INVENTION

In accordance with the present invention, a method is provided for forming a pair of MOSFETs in different electrically isolated regions of a silicon substrate, each one of the MOSFETs having a different gate oxide thickness. The method includes forming an isolation region in a portion of a surface of the silicon substrate. The isolation region separates the silicon substrate into the different electrically isolated regions. A first layer of silicon dioxide is grown to a predetermined thickness over the surface of the silicon substrate. One portion of the silicon dioxide layer is over one of the isolated regions and another portion of the silicon dioxide layer is over another one of the isolated regions. An inorganic layer is formed over the silicon dioxide layer. The inorganic layer extends over the isolated regions of the silicon substrate. A first portion of the inorganic layer is over the first one of the isolated regions and a second portion of the inorganic layer is over the second one of the isolated regions. The inorganic layer is patterned into an inorganic mask. A first portion of the inorganic layer exposes an underlying first portion of the surface of the silicon substrate while leaving a second portion of the inorganic layer over the second portion of the silicon dioxide layer. The inorganic mask is used to selectively remove exposed underlying portion of the grown silicon dioxide layer. The inorganic mask is then removed. A second layer of silicon dioxide is grown over the exposed underlying portion of the silicon substrate to a thickness different from the thickness of the first layer of silicon dioxide. The first and second silicon dioxide layers are patterned into gate oxides for each of a corresponding one of the pair of MOSFETs.

In accordance with another feature of the invention, the inorganic layer is silicon nitride, diamond-like carbon, silicon, germanium, or other non-contaminating material.

With such methods, the inorganic mask provides a non-contaminating mask which is used to remove the portion of the silicon dioxide from the surface of the silicon where the second gate silicon oxide, with thickness different from the first gate silicon dioxide, is to be formed.

In accordance with another feature of the invention, a method is provided for forming a pair of MOSFETs in different electrically isolated regions of a silicon substrate. Each one of the MOSFETs has a different gate oxide thickness. The method includes forming an isolation region in a portion of a surface of the silicon substrate. The isolation region separates the silicon substrate into the different electrically isolated regions. A first layer of silicon dioxide is grown to a predetermined thickness over the surface of the silicon substrate. One portion of the silicon dioxide layer is over one of the isolated regions and another portion of the silicon dioxide layer being over another one of the isolated regions. An inorganic layer is formed over the silicon dioxide layer, such inorganic layer extending over the isolated regions of the silicon substrate. A first portion of the inorganic layer is over the first one of the isolated regions and a second portion of the inorganic layer is over the second one of the isolated regions. A photoresist layer is formed over the inorganic layer. The photoresist layer is patterned with a window over the first portion of the inorganic layer. The photoresist layer covers the second portion of the inorganic layer. The inorganic layer is patterned into an inorganic mask by bringing a etch into contact with the patterned photoresist layer to selectively remove the first portion of the inorganic layer and thereby expose an underlying portion of the surface of the silicon substrate while leaving the second portion of the inorganic layer. The photoresist layer is removed. The inorganic mask is used to selectively remove exposed portions of the grown silicon dioxide. The inorganic mask is removed. A second layer of silicon dioxide is grown over the exposed underlying portion of the silicon substrate to a thickness different from the thickness of the first layer of silicon dioxide. The first and second silicon dioxide layers are patterned into gate oxides for each of a corresponding one of the pair of MOSFETs.

In accordance with another feature of the invention the inorganic layer is silicon nitride and is removed with hot phosphoric acid, a solution of hydrofluoric acid and ethylenglycol, or a solution of hydrofluoric acid and propylenecarbonate.

In accordance with another feature of the invention, the inorganic layer is diamond-like carbon and is removed with an oxygen based dry etch.

In accordance with another feature of the invention, the inorganic layer is silicon and is removed with a solution of two parts hydrofluoric acid, 15 parts nitric acid and 5 parts $CH_3COOH$, or potassium hydroxide.

In accordance with another feature of the invention, the inorganic layer is germanium and is removed with hydrogen peroxide.

BRIEF DESCRIPTION OF THE DRAWING

These and other features of the invention, as well as the invention itself, will become more readily apparent from the following detailed description when read together with the accompanying drawings, in which.

DESCRIPTION OF THE PREFERRED EMBODIMENTS

Figure 1A:
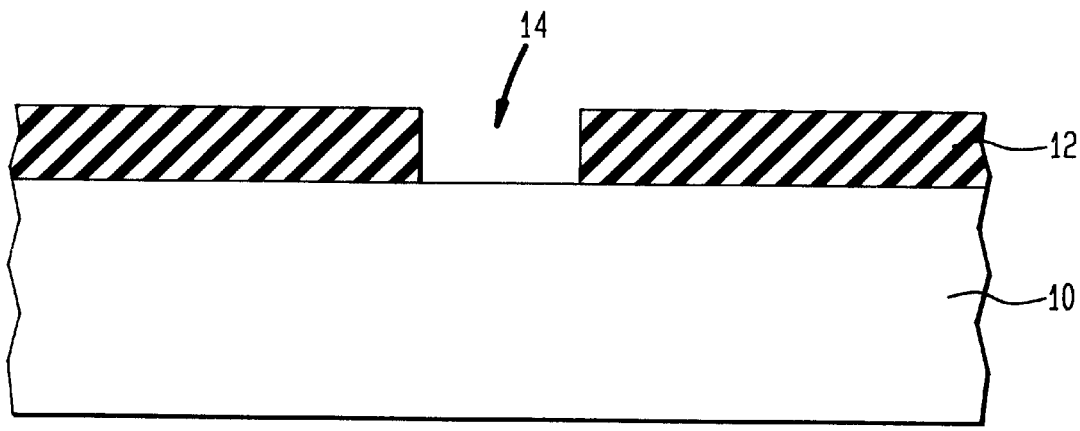
FIGS. 1A–1J are diagrammatic cross-sectional sketches of a semiconductor structure having a pair of MOSFETs with different gate oxide thicknesses at various stages in the fabrication thereof.

Referring now to FIGS. 1A through 1J, a method for forming a pair of MOSFETs in different electrically isolated regions of a silicon substrate, each one of the MOSFETs having a different gate oxide thickness, is described. Referring to FIG. 1A, a semiconductor substrate 10, here doped silicon, is provided with a photoresist mask 12 formed over a surface of the substrate. The mask 12 is patterned using conventional photolithography, to have a window 14 formed therein. The window 14 is formed to expose a portion of the silicon substrate 10 where an isolation region is to be formed to electrically isolate the pair of MOSFETs being fabricated.

Figure 1B:
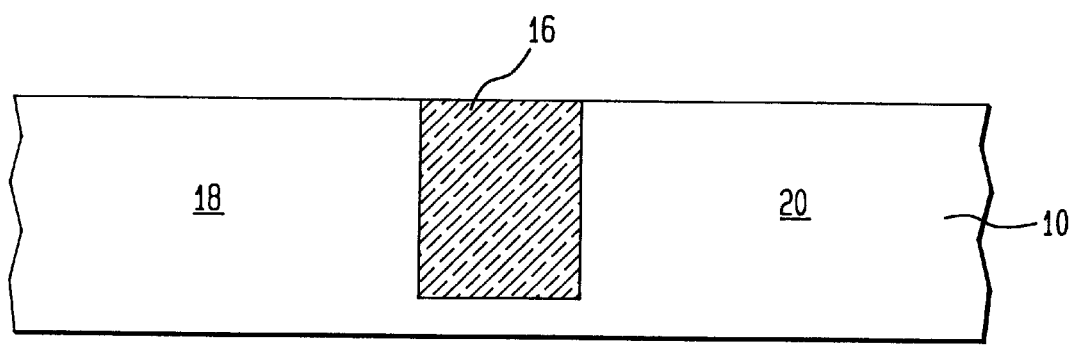

Referring to FIG. 1B, an isolation region 16, here a region of silicon dioxide is formed with any conventional process such as LOCOS or STI. The isolation region 16 separates the silicon substrate 10 into the different electrically regions 18, 20, as noted above. The photoresist layer 12 (FIG. 1A) is stripped using any conventional process as shown in FIG. 1B.

Figure 1C:
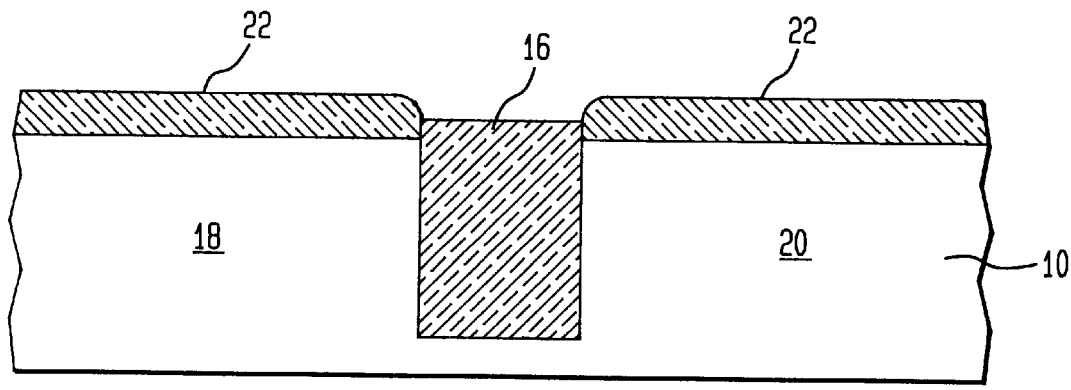

Referring to FIG. 1C, a layer 22 of silicon dioxide is thermally grown over the surface of the silicon substrate 10, as shown. Here, for example, the layer 22 of silicon dioxide has a thickness in the range of 10 to 500 A. Next, referring to FIG. 1D, a layer 24 of inorganic material, such as silicon nitride, diamond like carbon, silicon, or germanium, for example, is formed over the thermally grown silicon dioxide layer 22. For example, with a silicon nitride layer 24, the silicon nitride may be deposited to a thickness of about 50A–2000A using low pressure chemical vapor deposition. For diamond like carbon, the deposition may be to a thickness of 50–2000A using chemical vapor deposition (CVD). For silicon, the deposition may be to a thickness of 50–2000A using CVD. For germanium, the deposition may be to a thickness of 50–2000A using CVD.

Figure 1D:
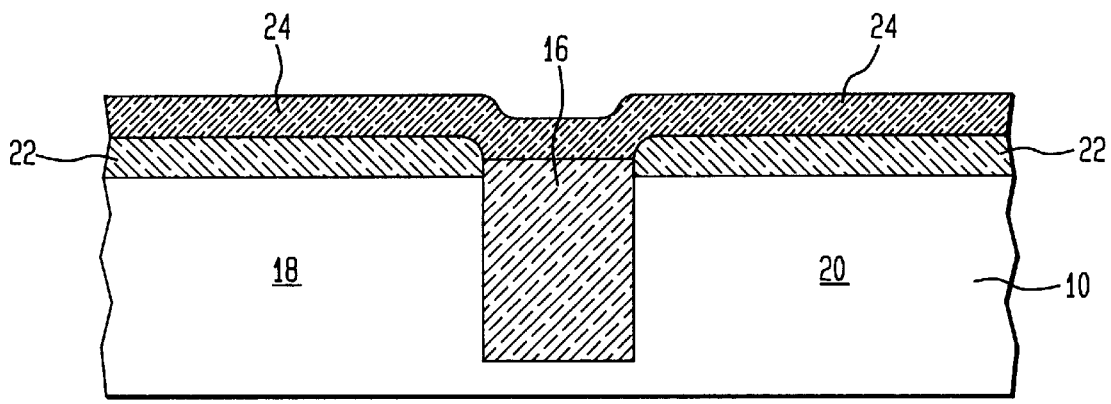
Figure 1E:
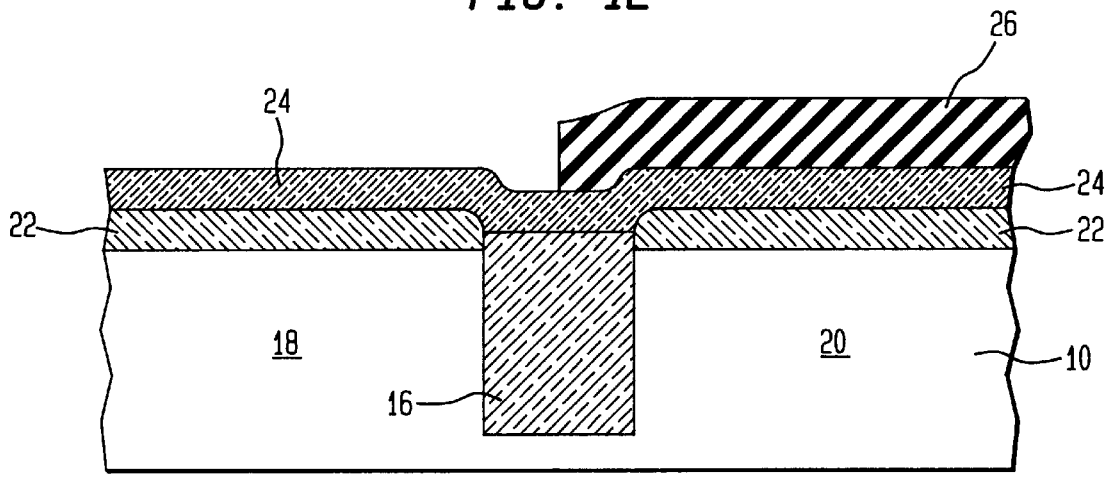
Figure 1F:
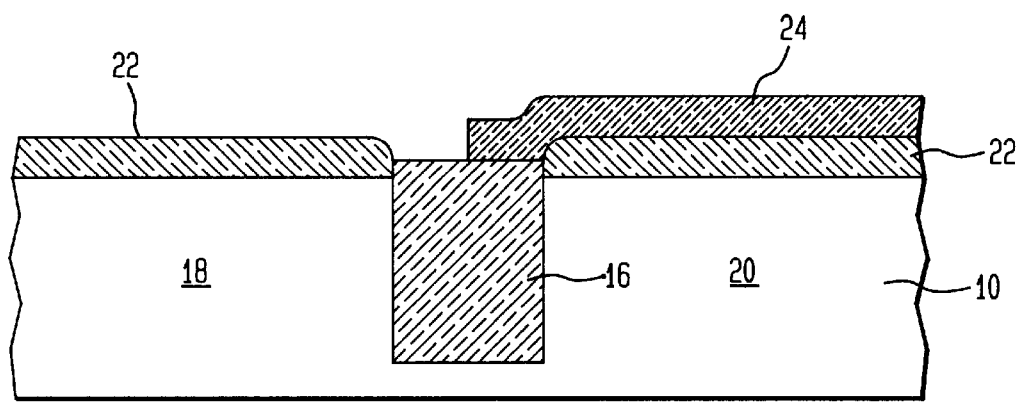
Figure 1G:
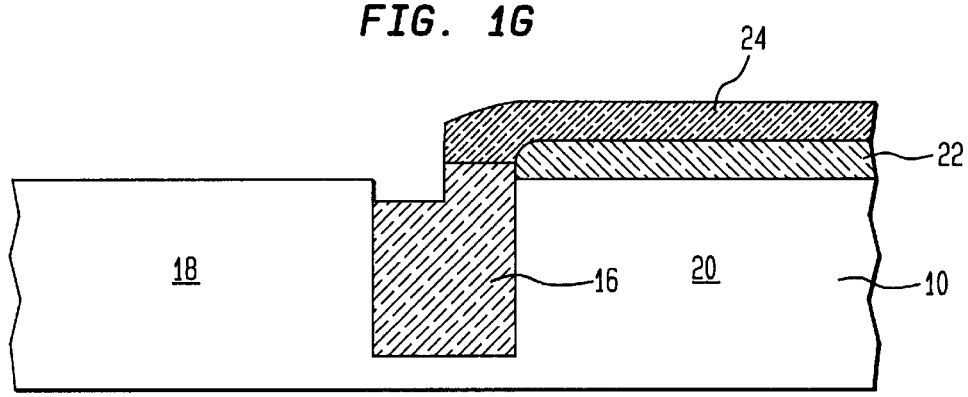

Referring now to FIG. 1E, a layer 26 of photoresist is formed over the structure shown in FIG. 1D and patterned as shown, using conventional techniques, to expose one of the two electrically isolated regions 18, 20 provided by the insulation material 16. Thus, it is noted that here the pattern photoresist layer 26 remains disposed over isolated region 20 while the portion of such photoresist layer 26 initially over region 18 has been removed. Using the patterned photoresist layer 26 as a mask for the inorganic layer 24, the portion of the inorganic layer 24 exposed by the photoresist layer 26 is removed with a suitable etch, e.g., a dry etch or a wet etch of hot phosphoric acid. After etching the exposed portion of the inorganic layer 24, the photoresist layer 26 is stripped. The resulting structure is shown in FIG. 1F. It is noted that the resulting patterned inorganic layer 24 forms a mask over the structure. More particularly, the inorganic mask (i.e., the now patterned inorganic layer 24) exposes the portion of the silicon dioxide layer 22 over region 18 of the substrate 10 while such patterned inorganic layer 24 remains disposed over region 20 of the substrate 10.

Referring now to FIG. 1F, a suitable etch is brought into contact with the inorganic mask 24 and the exposed portions of the silicon dioxide layer 22. The etch, here hydrofluoric acid-based wet etch, selectively removes the exposed silicon dioxide layer 22, thereby exposing the portion of the silicon substrate 10 surface in region 18, while leaving the inorganic masking layer 24 un-etched to thereby produce the structure shown in FIG. 1G.

Figure 1H:
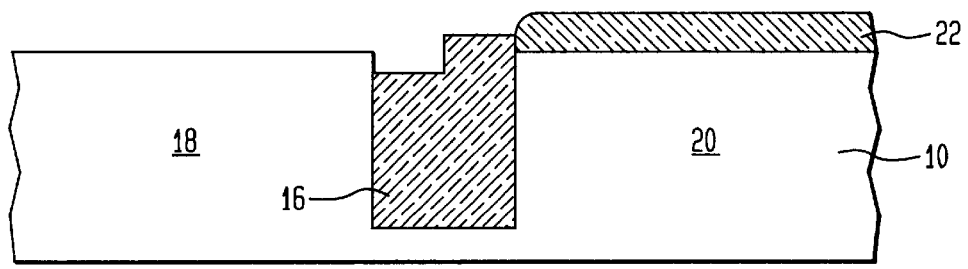

Next, referring to FIG. 1H, the surface of the structure is exposed to an etch which selectively removes the inorganic layer 24 while leaving un-etched the previously exposed silicon substrate 10 surface. As noted above, different materials may be used for the inorganic layer 24. With silicon nitride the etch is a wet etch, such as hot phosphoric acid, a solution of hydrofluoric acid and ethylenglycol, or a solution of hydrofluoric acid and propylenecarbonate and is used to remove the silicon nitride. With an inorganic layer of diamond-like carbon, an oxygen-based dry etch is used to remove the diamond-like carbon. With an inorganic layer of silicon, a wet etch is used to remove the silicon, such as a solution of two parts hydrofluoric acid, 15 parts nitric acid and 5 parts $CH_3COOH$, or potassium hydroxide. With an inorganic layer of germanium, the etch used to remove the germanium is a wet etch, such as hydrogen peroxide.

Figure 1I:
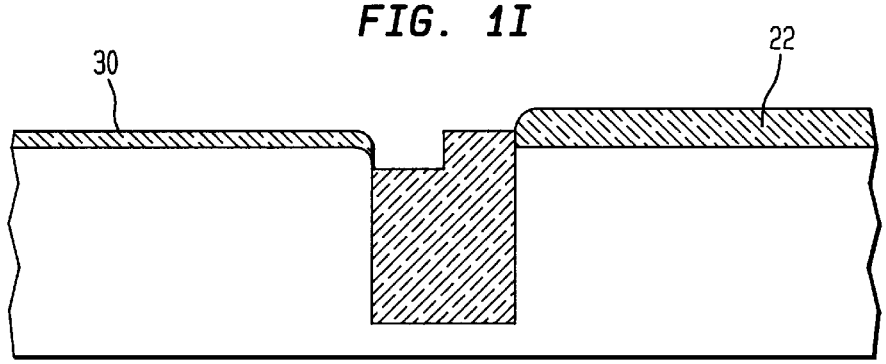

Referring to FIG. 1I, the structure shown in FIG. 1I is placed in an oxidizing ambient to thereby thermally grow a layer 30 of silicon dioxide over the exposed portion of the surface of the silicon substrate 10. It is noted that the layer 30 of silicon dioxide is here grown to a thickness different from, here less than, the thickness of the first thermally grown layer 22 of silicon dioxide. Here, for example, the thickness of layer 30 is in the range of 10–500A.

Figure 1J:
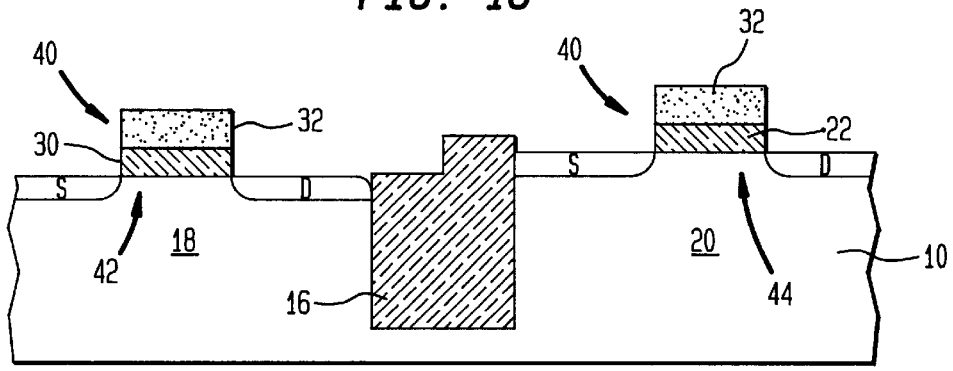

Next, referring to FIG. 1J, a layer 32 of doped polycrystalline silicon is formed over the surface of the structure shown in FIG. 1I, i.e., over the two thermally grown silicon dioxide layers 22, 30. The silicon dioxide layers 22, 30 and the doped polycrystalline silicon layer 32 are patterned into gate electrodes 40 for each of the MOSFETs 42, 44 formed in isolated regions 18, 20, respectively, using any conventional process. Doped source and drain regions (S,D) are then formed, as indicated, using any conventional process.

It should be noted that threshold voltages will be different for each of the MOSFETs 42, 44 and therefore different Vt implantation may be required to control these different threshold voltages. Therefore, before the deposition of the polycrystalline silicon layer 32, the structure is subjected to an ion implantation of proper dosage to set Vt. Therefore, there may be a need for two different implants; one for each of the MOSFETs 42, 44. The implantation is performed after the thermally grown silicon dioxide layer 30 is formed but before the doped polycrystalline layer 32 is deposited.

Other embodiments are within the spirit and scope of the appended claims.

What is claimed is:

1. A method for forming a pair of MOSFETs in different electrically isolated regions of a silicon substrate, each one of the MOSFETs having a different gate oxide thickness, comprising:

forming an isolation region in a portion of a surface of the silicon substrate, such isolation region separating the silicon substrate into the different electrically isolated regions;

growing a first layer of silicon dioxide to a thickness over the surface of the silicon substrate, one portion of the silicon dioxide layer being over a first one of the isolated regions and another portion of the silicon dioxide layer being over a second one of the isolated regions;

forming an inorganic layer over the silicon dioxide layer, such inorganic layer extending over the isolated regions of the silicon substrate, a first portion of the inorganic layer being over the first one of the isolated regions and a second portion of the inorganic layer being over the second one of the isolated regions;

patterning the inorganic layer into an inorganic mask, a first portion of the inorganic layer exposing an underlying first portion of the surface of the silicon substrate while leaving a second portion of the inorganic layer over the second portion of the silicon dioxide layer;

using the inorganic mask to selectively remove exposed underlying portion of the grown silicon dioxide layer;

removing the inorganic mask;

subsequent to the removal of the inorganic mask, growing a second layer of silicon dioxide over the exposed underlying portion of the silicon substrate to a thickness different from the thickness of the first layer of silicon dioxide;

patterning the first and second silicon dioxide layers into gate oxides for each of a corresponding one of the pair of MOSFETs.

2. The method recited in claim 1 wherein the inorganic layer is silicon nitride.

3. The method recited in claim 2 wherein the silicon nitride mask is removed with a wet etch.

4. The method recited in claim 3 wherein the wet etch is hot phosphoric acid, a solution of hydrofluoric acid and ethylenglycol, or a solution of hydrofluoric acid and propylenecarbonate.

5. The method recited in claim 1 wherein the inorganic layer is diamond-like carbon.

6. The method recited in claim 5 wherein the diamond-like carbon is removed with a dry etch.

7. The method recited in claim 5 wherein the dry etch is an oxygen-based dry etch.

8. The method recited in claim 1 wherein the inorganic layer is silicon.

9. The method recited in claim 8 wherein the silicon is removed with a wet etch.

10. The method recited in claim 9 wherein the wet etch is a solution of two parts hydrofluoric acid, 15 parts nitric acid and 5 parts $CH_3COOH$, or potassium hydroxide.

11. The method recited in claim 1 wherein the inorganic layer is germanium.

12. The method recited in claim 11 wherein the etch is a wet etch.

13. The method recited in claim 12 wherein the wet etch is hydrogen peroxide.

14. A method for forming a pair of MOSFETs in different electrically isolated regions of a silicon substrate, each one of the MOSFETs having a different gate oxide thickness, comprising:

forming an isolation region in a portion of a surface of the silicon substrate, such isolation region separating the silicon substrate into the different electrically isolated regions;

growing a first layer of silicon dioxide to a thickness over the surface of the silicon substrate, one portion of the silicon dioxide layer being over a first one of the isolated regions and another portion of the silicon dioxide layer being over a second one of the isolated regions;

forming an inorganic layer over the silicon dioxide layer, such inorganic layer extending over the isolated regions of the silicon substrate, a first portion of the inorganic layer being over the first one of the isolated regions and a second portion of the inorganic layer being over the second one of the isolated regions;

forming a photoresist layer over the inorganic layer;

patterning the photoresist layer with a window over the first portion of the inorganic layer, such photoresist layer covering the second portion of the inorganic layer;

patterning the inorganic layer into an inorganic mask comprising bringing a etch into contact with the patterned photoresist layer to selectively remove the first portion of the inorganic layer an thereby expose an underlying portion of the surface of the silicon substrate while leaving the second portion of the inorganic layer;

removing the photoresist layer;

using the inorganic mask to selectively remove exposed portions of the grown silicon dioxide;

removing the inorganic mask;

subsequent to removal of the inorganic mask, growing a second layer of silicon dioxide over the exposed underlying portion of the silicon substrate to a thickness different from the thickness of the first layer of silicon dioxide;

patterning the first and second silicon dioxide layers into gate oxides for each of a corresponding one of the pair of MOSFETs.

15. The method recited in claim 14 wherein the inorganic layer is silicon nitride.

16. The method recited in claim 15 wherein the silicon nitride mask is removed with a wet etch.

17. The method recited in claim 16 wherein the wet etch is hot phosphoric acid, a solution of hydrofluoric acid and ethylenglycol, or a solution of hydrofluoric acid and propylenecarbonate.

18. The method recited in claim 14 wherein the inorganic layer is diamond-like carbon.

19. The method recited in claim 18 wherein the etch used to remove the diamond-like carbon is a dry etch.

20. The method recited in claim 19 wherein the dry etch is an oxygen-based dry etch.

21. The method recited in claim 14 wherein the inorganic layer is silicon.

22. The method recited in claim 21 wherein the etch used to remove the silicon is a wet etch.

23. The method recited in claim 22 wherein the wet etch is a solution of two parts hydrofluoric acid, 15 parts nitric acid and 5 parts $CH_3COOH$, or potassium hydroxide.

24. The method recited in claim 14 wherein the inorganic layer is germanium.

25. The method recited in claim 24 wherein the inorganic layer is removed with a wet etch.

26. The method recited in claim 25 wherein the wet etch is hydrogen peroxide.

* * * * *